United States Patent
Bhattacharya et al.

(10) Patent No.: US 7,529,071 B2
(45) Date of Patent: May 5, 2009

(54) CIRCUIT FOR SELECTIVELY BYPASSING A CAPACITIVE ELEMENT

(75) Inventors: Dipankar Bhattacharya, Macungie, PA (US); Makeshwar Kothandaraman, Whitehall, PA (US); John C. Kriz, Palmerton, PA (US); Bernard L. Morris, Emmaus, PA (US); Yehuda Smooha, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 246 days.

(21) Appl. No.: 11/535,719

(22) Filed: Sep. 27, 2006

(65) Prior Publication Data

US 2008/0074814 A1 Mar. 27, 2008

(51) Int. Cl.
*H02H 3/22* (2006.01)
(52) U.S. Cl. .......................... 361/56; 361/111
(58) Field of Classification Search .................... 361/56, 361/58, 91, 111
See application file for complete search history.

(56) References Cited

U.S. PATENT DOCUMENTS

| | | | | |
|---|---|---|---|---|
| 6,163,199 A | * | 12/2000 | Miske et al. | 327/434 |
| 6,218,854 B1 | * | 4/2001 | Ko | 326/30 |
| 6,433,985 B1 | * | 8/2002 | Voldman et al. | 361/113 |
| 6,566,934 B1 | * | 5/2003 | Goren et al. | 327/337 |

* cited by examiner

*Primary Examiner*—Danny Nguyen
(74) *Attorney, Agent, or Firm*—Ryan, Mason & Lewis, LLP (57) ABSTRACT

A circuit for selectively bypassing a capacitive element includes at least one NMOS device selectively connectable across the capacitive element to be bypassed, and at least first and second PMOS devices. The PMOS devices are selectively connectable together in series across the capacitive element to be bypassed. The NMOS device provides a first bypass path and the first and second PMOS devices collectively provide a second bypass path.

19 Claims, 3 Drawing Sheets

CIRCUIT FOR SELECTIVELY BYPASSING A CAPACITIVE ELEMENT

FIELD OF THE INVENTION

The present invention relates generally to electronic circuits, and more particularly relates to circuits for bypassing alternating current (AC) coupled inputs.

BACKGROUND OF THE INVENTION

For certain high-speed applications, low voltage core devices (which are generally faster than high voltage input/output (IO) devices) are often used, for example, in a differential reference clock buffer. This clock buffer typically needs to interface with input signals (e.g., low voltage positive emitter coupled logic (LVPECL), low voltage differential signal (LVDS), common mode logic (CML), etc.) having a variety of signal levels and common modes.

In order to accommodate signals having such a wide variety of signal levels and common modes, inputs to the buffer are typically AC coupled, such as, for example, by placing coupling capacitors in series with the respective inputs. During boundary scan, or an alternative test mode, however, when a signal applied to a given input is toggled at a much lower rate, the coupling capacitor corresponding to the given input needs to be bypassed. Typically, in a bypass mode of operation, a high voltage n-channel metal-oxide-semiconductor (NMOS) switch is used to selectively shunt the coupling capacitor in response to a bypass signal. A voltage translator circuit is generally not used to translate the bypass signal because the voltage translator circuit is known to be susceptible to electrostatic discharge (ESD) events (e.g., charged device model (CDM)), and use of a noisy high voltage IO supply can be avoided.

One problem exhibited by conventional bypass circuitry is that the high voltage NMOS switch commonly used to shunt the coupling capacitor often fails to fully short out the capacitor. A high voltage p-channel metal-oxide-semiconductor (PMOS) switch can be connected in parallel with the NMOS switch to help shunt the coupling capacitor during bypass mode. However, a high voltage control signal would be required in order to turn off this PMOS device under normal operation of the buffer, thereby necessitating a voltage level translator circuit and a high voltage power supply, which is undesirable.

Accordingly, there exists a need for improved techniques for bypassing AC coupled inputs of a circuit which does not suffer from one or more of the above-noted problems exhibited by conventional bypass circuitry.

SUMMARY OF THE INVENTION

The present invention meets the above-noted need by providing, in illustrative embodiments thereof, improved techniques for bypassing an AC coupled input of a circuit without the need for voltage translation circuitry and/or a high voltage power supply.

In accordance with one embodiment of the invention, a circuit for selectively bypassing a capacitive element includes at least one NMOS device selectively connectable across the capacitive element to be bypassed, and at least first and second PMOS devices. The PMOS devices are selectively connectable together in series across the capacitive element to be bypassed. The NMOS device provides a first bypass path and the first and second PMOS devices collectively provide a second bypass path. The circuit is preferably selectively operative in one of at least first and second modes as a function of at least one control signal, the circuit shunting the capacitive element through the first and second bypass paths in the first mode, and the circuit being operative to open the first and second bypass paths and thereby prevent the shunting of the capacitive element in the second mode.

In accordance with another embodiment of the invention, an input stage for a buffer circuit includes a signal pad adapted to receive a signal applied to the buffer circuit, at least one capacitive element coupled between the signal pad and a subsequent stage of the buffer circuit, and at least one bypass circuit for selectively bypassing the capacitive element corresponding thereto. The bypass circuit includes at least one NMOS device selectively connectable across the capacitive element and providing a first bypass path, and at least first and second PMOS devices, the PMOS devices being selectively connectable together in series across the capacitive element and collectively providing a second bypass path.

In accordance with yet another embodiment of the invention, an integrated circuit includes at least one bypass circuit formed in the manner described above.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of illustrative bypass circuitry for bypassing AC coupled inputs of a circuit. It should be understood, however, that the present invention is not limited to these or any other particular circuit arrangements. Rather, the invention is more generally applicable to techniques for selectively bypassing a capacitive element (e.g., capacitor) so as to more effectively enable an AC coupled input and/or output of a circuit to be used to convey (e.g., receive and/or transmit) high speed signals of a variety of signal levels and common modes in a first (e.g., normal) mode of operation, and to convey much lower rate signals in a second (e.g., test) mode of operation. Moreover, techniques of the invention eliminate the need for voltage level translation circuitry and/or a high voltage power supply.

Although implementations of the present invention are described herein with specific reference to PMOS and NMOS transistor devices, as may be formed using a complementary metal-oxide-semiconductor (CMOS) fabrication process, it is to be understood that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be apparent to those skilled in the art.

Traditional mixed signal integrated circuit (IC) processes typically offer both "high voltage" and "low voltage" transistor devices. The high voltage devices generally have a nominal threshold voltage of, for example, about 0.75 volt and are intended to operate with a higher supply voltage, which may be VDDIO (e.g., about 3.3 volts). The low voltage devices have a nominal threshold voltage which is substantially lower than the high voltage devices, such as, for example, about 0.35 volt, and are intended to operate with a lower core supply voltage, which may be VDDCORE (e.g., about 1.0 volt).

Figure 1:
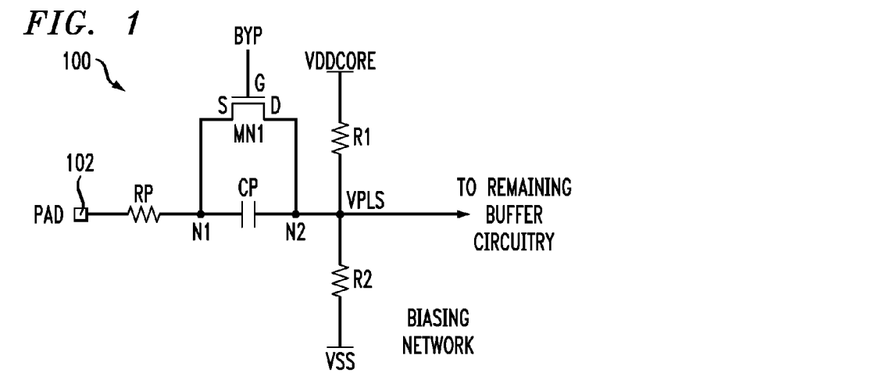
FIG. 1 is a schematic diagram depicting a front end of an illustrative AC-coupled buffer in which techniques of the present invention may be implemented.

FIG. 1 is a schematic diagram depicting an illustrative front end 100 of an AC-coupled buffer (e.g., differential receiver) which may be modified to implement techniques of the present invention. Front end 100 preferably includes an IO pad (PAD) 102, which may be a positive input of a differential input receiver, connected to a coupling capacitor, CP, through an ESD resistor, RP. Specifically, a first terminal of resistor RP is adapted for connection to the pad 102, a second terminal of resistor RP is connected to a first terminal of capacitor CP at node N1, and a second terminal of CP is adapted for connection to remaining portions (e.g., input stage) of the buffer at node N2. Since the input signal level to the buffer can be much higher than 1.0 volt, a high voltage transistor device is preferably used to implement capacitor CP. Although the buffer is preferably powered by a lower core supply, which may be VDDCORE (e.g., about 1.0 volt nominal, 1.26 volts maximum), the buffer can accommodate input signals with an amplitude as high as about 1.98 volts for an illustrative TSMC CLN90G 90-nanometer (nm) IC fabrication process with 26-angstrom gate oxide devices. It should be understood, however, that the invention is not limited to signals of any particular voltage level, nor is it limited to any particular IC fabrication process.

A bias circuit is preferably included in front end 100 in order to set a common mode of the buffer input at a prescribed voltage level. The bias circuit may be implemented as a simple voltage divider as shown, including first and second resistors, R1 and R2, respectively, coupled together in series between the lower core supply, VDDCORE, and a supply voltage return, VSS, of the buffer. A junction of resistors R1 and R2 is connected to node N2. A bias voltage, VPLS, at node N2 will be a function of the value of resistors R1 and R2, as well as a function of the difference between VDDCORE and VSS. Alternative bias circuit arrangements are similarly contemplated by the invention.

Front end 100 of the buffer further comprises a bypass circuit including a high voltage NMOS device, MN1, connected across coupling capacitor CP. A source (S) of device MN1 is connected to the first terminal of capacitor CP at node N1, a drain (D) of MN1 is connected to the second terminal of CP at node N2, and a gate (G) of MN1 is adapted for receiving a control signal, BYP. During a bypass mode of operation, control signal BYP is a logic high level (e.g., "1") to turn on NMOS device MN1, thereby shunting capacitor CP and allowing low speed signals, or even DC signals, to pass through to the buffer input stage (not explicitly shown). During normal operation of the buffer, control signal BYP is a logic low level (e.g., "0") to turn off device MN1, thereby substantially attenuating low-speed input signals applied to front end 100 as a function of a capacitance value of capacitor CP.

Control signal BYP is not translated up in voltage because to do so would necessitate the inclusion of voltage level translation circuitry and an additional higher IO supply in the buffer, which is undesirable. Moreover, during an ESD event, charge accumulated on the IO supply will discharge through low voltage core devices in the voltage level translation circuitry. This occurs primarily because typically only one voltage level translator cell is employed in a given buffer connecting the lower core supply VDDCORE and a higher IO supply, which may be VDDIO. Thus, it is advantageous to eliminate the need for voltage level translation circuitry in the buffer. Furthermore, by avoiding the use of an IO supply, the buffer is not only less susceptible to IO supply noise, but one less voltage supply is required to operate the buffer.

Unfortunately, since control signal BYP is referenced to the lower core supply voltage VDDCORE, there may not be adequate overdrive when BYP is a logic high level (e.g., about 1.0 volt) to turn on NMOS device MN1 so as to fully shunt the coupling capacitor CP. Therefore, during low-speed testing of the buffer (e.g., boundary scan testing), even though the coupling capacitor CP is partially bypassed, at least some capacitive action will remain. The signal at node N2 will essentially always settle to the bias voltage VPLS in the logic high state. When the bypassed signal is compared against the DC bias level of VPLS, for example, using an offset comparator, as is done, for example, in an Institute of Electrical and Electronics Engineers (IEEE) 1149.1 standard (see, e.g., IEEE Std 1149.1-1990, entitled "IEEE Standard Test Access Port and Boundary-Scan Architecture—Description," which is incorporated by reference herein), a signal having the wrong polarity will be generated at an output of the buffer.

As previously stated, a high voltage PMOS device can be connected in parallel with the high voltage NMOS device to help shunt the coupling capacitor CP during bypass mode. In this instance, a logical complement of control signal BYP would be applied to a gate of the PMOS device. However, in order to turn off this PMOS device under normal operation of the buffer, the complement of control signal BYP must be able to swing to a high logic level which is referenced to a higher IO supply, thereby necessitating a voltage level translator circuit and a corresponding high voltage supply, which introduces the same ESD issue, as well as other disadvantages, as previously described.

Figure 2:
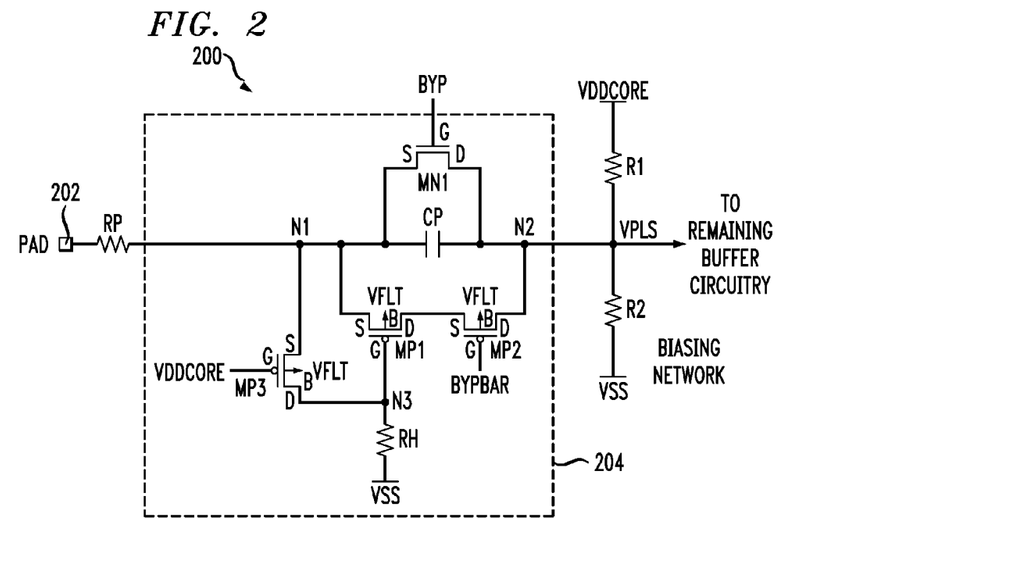
FIG. 2 is a schematic diagram depicting a front end of an illustrative AC-coupled buffer including an exemplary bypass circuit, formed in accordance with an embodiment of the present invention.

FIG. 2 is a schematic diagram depicting an improved front end 200 of an illustrative AC-coupled buffer including an exemplary bypass circuit formed in accordance with an embodiment of the present invention. Front end 200 includes an IO pad (PADP) 202, as may be used for providing external access to the buffer, such as for receiving signals applied to the buffer (in the case of an input buffer), transmitting signals generated by the buffer (in the case of an output buffer), or both receiving and transmitting signals (in the case of a bidirectional buffer). Pad 202, which may be, for example, a non-inverting input or an inverting input of a differential input receiver, is connected to a coupling capacitor, CP, or alternative capacitive element (e.g., metal-oxide-semiconductor (MOS) capacitor, etc.), through an ESD resistor, RP. Specifically, a first terminal of resistor RP is adapted for connection to the IO pad 202, a second terminal of resistor RP is connected to a first terminal of capacitor CP at node N1, and a second terminal of CP is adapted for connection to remaining portions (e.g., input stage) of the buffer at node N2.

Since the input signal level to the buffer can be much higher than a lower core supply, VDDCORE, which preferably provides power to the buffer (e.g., greater than about 1.0 volt), capacitor CP is preferably implemented by a high voltage transistor device. Although the buffer is preferably powered by the lower core supply, which may be VDDCORE (e.g., about 1.0 volt nominal, 1.26 volts maximum), the buffer can accommodate input signals with an amplitude of about 2.0 volts or higher, depending on the IC fabrication process. It should be understood, however, that the invention is not limited to signals of any particular voltage level, nor is it limited to any particular IC fabrication process.

In order to set the common mode of the buffer input at a prescribed voltage level, front end 200 preferably includes a bias circuit. The bias circuit may be implemented as a simple voltage divider as shown, including first and second resistors, R1 and R2, respectively, coupled between the lower core supply of the buffer VDDCORE and a supply voltage return of the buffer, which may be VSS. Specifically, a first terminal of resistor R1 is preferably adapted for connection to VDDCORE, a second terminal of R1 is connected to the second terminal of capacitor CP and to a first terminal of resistor R2 at node N2, and a second terminal of R2 is adapted for connection to VSS. Alternative bias circuit arrangements are similarly contemplated by the invention. Using the voltage divider arrangement shown, the bias voltage, VPLS, at node N2 will be equal to $$(VDDCORE - VSS) \times \frac{R2}{R1 + R2}.$$

In accordance with one aspect of the invention, a bypass circuit 204 suitable for use in front end 200 of the buffer is provided. Bypass circuit 204 is selectively operable in one of at least two modes. In a first mode, which may be a bypass or test mode of the circuit connection, the bypass circuit 204 is preferably operative to fully shunt coupling capacitor CP. In this manner, bypass circuit 204 allows the front end 200 to convey much lower rate signals, even DC signals, to remaining portions of the buffer (e.g., input stage). Moreover, techniques of the invention eliminate the need for voltage level translation circuitry and/or a high voltage power supply. In a second mode, which may be a normal operating mode of the circuit connection, the bypass circuit 204 is preferably disabled.

Bypass circuit 204 comprises a high voltage NMOS device, MN1, connected across coupling capacitor CP, and two low voltage PMOS devices, MP1 and MP2, connected in series with one another and across coupling capacitor CP. Specifically, a source of NMOS device MN1 is connected to the first terminal of capacitor CP at node N1, a drain of MN1 is connected to the second terminal of CP at node N2, and a gate of MN1 is adapted to receive a control signal, BYP. A source of PMOS device MP1 is connected to the first terminal of capacitor CP at node N1, a drain of MP1 is connected to a source of PMOS device MP2, a drain of MP2 is connected to the second terminal of CP at node N2, a gate of MP1 is connected to VSS through a series connected resistor, RH, or an alternative pull-down arrangement, and a gate of MP2 is adapted to receive a control signal, BYPBAR, which is a logical complement of control signal BYP. Resistor RH is preferably substantially high in value (e.g., greater than about 100 kilo (K) ohms). A third low voltage PMOS device, MP3, is connected across the source and gate of PMOS device MP1. Specifically, a source of PMOS device MP3 is connected to the source of PMOS device MP1 at node N1, a drain of MP3 is connected to the gate of MP1 at node N3, and a gate of MP3 is adapted for connection to lower core supply VDDCORE.

It is to be appreciated that, because a MOS device is symmetrical in nature, and thus bi-directional, the assignment of source and drain designations in the MOS device is essentially arbitrary. Therefore, the source and drain may be referred to herein generally as first and second source/drain, respectively, where "source/drain" in this context denotes a source or a drain.

Essentially all PMOS and NMOS devices have associated therewith parasitic diodes between their source/drains and the underlying well or substrate in which the devices are formed. When the voltage at pad 202 exceeds the supply voltage VDDCORE by about a threshold voltage of a given one of the PMOS devices MP1, MP2, MP3, the parasitic diode associated with the given device will undesirably become forward-biased, thereby conducting a large current. This large diode current can trigger latch-up or, at a minimum, cause significant parasitic currents to flow.

Figure 3:
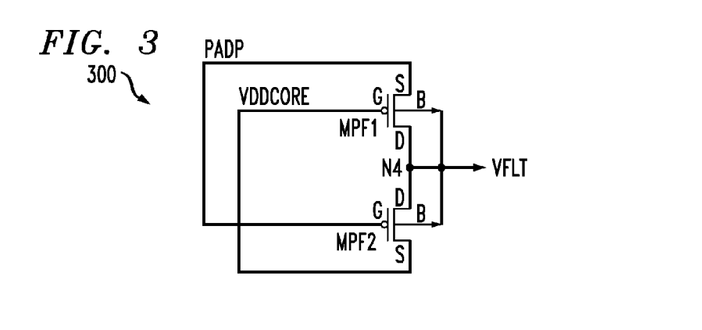
FIG. 3 is a schematic diagram depicting an exemplary bias circuit suitable for use in the bypass circuit shown in FIG. 2, in accordance with another aspect of the present invention.

In order to prevent the parasitic diodes in the PMOS devices from becoming forward-biased, a bulk (B) of each of PMOS devices MP1, MP2 and MP3, which provides electrical connection to the respective wells (also referred to as tubs) in which the PMOS devices are formed, is preferably connected to a voltage, VFLT, which is preferably equal to the greater of the input signal level or the lower core supply VDDCORE, as will be described below in conjunction with FIG. 3. Traditionally, the bulk connection of a PMOS device in a given circuit is connected to the positive voltage supply of the circuit, which in the illustrative circuit shown is VDDCORE. However, for a circuit configured to receive input signals having levels that may exceed the voltage supply of the circuit, latch-up can occur. The bulk connection arrangement of the PMOS devices in bypass circuit 204 beneficially reduces the likely that latch-up will occur.

Operation of the bypass circuit 204 will now be described. By way of example, during normal operation of bypass circuit 204, control signal BYP is at a logic low level (e.g., zero volt) and control signal BYPBAR, being a logical complement of BYP, is at a logic high level (e.g., 1.0 volt). NMOS device MN1, being gated by a logic low signal, will be turned off, thus providing essentially no electrical path (other than perhaps a substantially high resistance leakage path) to shunt coupling capacitor CP. Assuming the input signal level applied to front end 200 at pad 202 is less than or about equal to the lower core supply VDDCORE (e.g., in a range between about 0 and about 1.0 volt), PMOS device MP3 will be turned off, thereby allowing the gate of PMOS device MP1 to be pulled to VSS (e.g., zero volt). With the gate of PMOS device MP1 at zero, MP1 will be turned on. However, PMOS device MP2, being gated by a logic high signal, will be turned off, thus providing essentially no electrical path (other than perhaps a substantially high resistance leakage path) to shunt coupling capacitor CP. Hence, bypass circuit 204 is disabled and coupling capacitor CP functions as intended.

Again during normal operation, when the input signal applied to front end 200 at pad 202 rises about a threshold voltage above VDDCORE (e.g., VDDCORE+about 0.35 volt), PMOS device MP3 turns on, thereby pulling the gate of PMOS device MP1 to about PADP potential. This effectively turns off PMOS device MP1. There will be a current path from pad 202, through ESD resistor RP, PMOS device MP3, and resistor RH to VSS. This current can be selectively restricted as a function of the value of resistor RH which, as stated above, is preferably chosen to be substantially high in value. Other circuit arrangement can be used instead of resistor RH to further reduce this current. For example, resistor RH may be replaced by an active device that can be selectively turned off in response to a control signal applied thereto. Since the source/drain nodes of PMOS devices MP1 and MP2 can be exposed to a voltage which is higher than the lower core supply, the tubs in which these devices are formed are taken to that higher potential in order to prevent the parasitic diodes therein from turning on and causing a latch-up condition.

During a bypass mode of operation, bypass circuit 204 is operative to fully shunt coupling capacitor CP. It is to be noted that, when in bypass mode, the input signal applied to pad 202 passes straight through ESD resistor RP to remaining portions of the buffer circuit, and therefore the input signal level should be restricted to lower core voltage levels (e.g., about 1.26 volt or less). In bypass mode, signal BYP is at a logic high level (e.g., about 1.0 volt). NMOS device MN1, being gated by a logic high signal, will be at least partially turned on, thereby providing an electrical path to help shunt coupling capacitor CP. However, as previously explained, depending on certain IC process, voltage and temperature (PVT) conditions to which the buffer (particularly front end 200 of the buffer) may be subjected, there may not be enough overdrive to turn on device MN1 to the point that it exhibits a sufficiently low on-resistance between its source and drain nodes.

Since pad 202 is preferably less than or about equal to the core voltage VDDCORE, PMOS device MP3 is turned off and PMOS device MP1 is turned on. Control signal BYPBAR, being a logical complement of BYP, is at a logic low level (e.g., zero volt). PMOS device MP2, being gated by the logic low BYPBAR signal, will be turned on. With both devices MP1 and MP2 turned on, a low-resistance electrical path will be formed between nodes N1 and N2, thereby shunting coupling capacitor CP. The parallel combination of the electrical path through NMOS device MN1 and the electrical path through PMOS devices MP1 and MP2 will fully shunt capacitor CP such that the voltage at node N2 will substantially follow the input signal at pad 202, as desired. Moreover, capacitor CP will be fully shunted, in accordance with techniques of the invention, without the need for voltage level translation circuitry or the need for an additional high voltage supply.

Replacing the low voltage PMOS devices MP1, MP2 and MP2 with high voltage PMOS devices (e.g., about 70-angstrom gate oxide for 3.3-volt applications or 50-angstrom gate oxide for 2.5-volt applications), the bypass circuit 204 can be made to accommodate 3-volt signaling levels, in accordance with another aspect of the invention. For normal operation, the input signal at pad 202 can be as high as about 3.63 volts. When the input signal is at a 1-volt level, device MP3 will be turned off since MP3 is gated by VDDCORE. Device MP1 will be turned on since its gate will be pulled to VSS. However, device MP2 will be turned off because its source is at a 1-volt level and so is its gate which receives the signal BYPBAR (which is at a logic high level during normal operation). When the input signal at pad 202 exceeds about one threshold above VDDCORE and up to about 3.6 volts, device MP3 will be turned on, thereby taking the gate potential of device MP1 to the input signal level at pad 202. This turns off device MP1, and thus an electrical path through the PMOS devices MP1 and MP2 will not be established.

It is to be appreciated that one or more components of the front end 200 may be incorporated into the bypass circuit. For example, the coupling capacitor CP may be included in bypass circuit 204, in accordance with an embodiment of the invention. In another embodiment, the bias circuit, which in illustrative front end 200 is implemented as a simple voltage divider comprised of resistors R1 and R2, may be included in bypass circuit 204. Likewise, although ESD resistor RP is preferably located in close relative proximity to the pad 202, resistor RP may be included in bypass circuit 204.

As previously stated, bypass circuit 204 requires the generation of a voltage VFLT for biasing the wells in which PMOS devices MP1, MP2, and MP3 are formed. FIG. 3 is a schematic diagram depicting an exemplary voltage generator circuit 300 for generating the bias voltage VFLT for bypass circuit 204 shown in FIG. 2. Voltage generator circuit 300 includes two PMOS devices, MPF1 and MPF2, connected in series between voltages VDDCORE and PADP, which is the voltage at pad 202 (see FIG. 2), with a bias voltage, VFLT, being generated at a common node N4. PMOS devices MPF1 and MPF2 can be low voltage devices, assuming the voltage supply, in this case VDDCORE, supplying power to voltage generator circuit 300 is about 1.8 volts or less, otherwise MPF1 and MPF2 are high voltage devices.

Device MPF1 is gated by VDDCORE and device MPF2 is gated by PADP. Specifically, a source of MPF2 is connected to VDDCORE, a gate of MPF2 is connected to PADP, a source of MPF1 is connected to PADP and a gate of MPF1 is connected to VDDCORE. A drain and bulk of MPF1 is connected to a drain and bulk of MPF2 at node N4 to generate the bias voltage VFLT for biasing the n-wells of PMOS devices MP1, MP2 and MP3 shown in FIG. 2. This bias voltage is supplied to the bulk of MP1, MP2 and MP3. Voltage generator circuit 300 may be incorporated into bypass circuit 204, or it may reside externally to the bypass circuit and be shared by more than one bypass circuit.

When PADP is lower than VDDCORE by about one threshold or more (e.g., PADP is about 0.5 volt and VDDCORE is about 1.0 volt), MPF2 will be turned on and MPF1 will be turned off, thus setting VFLT substantially equal to VDDCORE. When PADP is less than about one threshold above or below VDDCORE, both devices MPF1, MPF2 will be turned off and VFLT essentially floats. When PADP is higher than VDDCORE by about one threshold or more (e.g., PAD is about 2.0 volts and VDDCORE is about 1.0 volt), device MPF1 turns on and MPF2 turns off, thereby setting VFLT substantially equal to PADP. In either of these cases, the voltage VFLT will be the higher of either VDDCORE or PADP.

Figure 4:
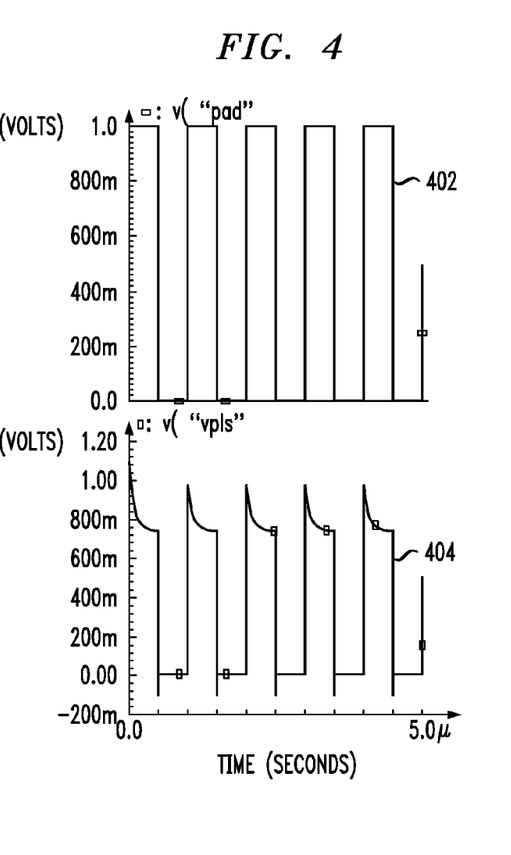
FIG. 4 is a graphical representation depicting illustrative simulation results for certain nodes in the exemplary buffer front end shown in FIG. 1.

FIG. 4 is a graphical representation depicting illustrative simulation results for certain nodes in the exemplary buffer front end 100 shown in FIG. 1. Trace 402 shows an input signal ("pad") applied to pad 102 during a bypass mode of operation. The input signal level in this example is at core logic levels (e.g., 0 and 1.0 volt). Trace 404 shows the signal ("vpls") at node N2 of front end 100 (see FIG. 1). For ease of illustration, traces 402 and 404 are graphed on separate voltage axes (y-axis) but share the same time axis (x-axis). In this example, it is assumed that the DC bias voltage VPLS is about 700 millivolts (mV), although the invention is not limited to any particular bias voltage. It is apparent from the figure that when the input signal goes high, the signal at node N2 follows the input signal, but then settles to the DC bias level (e.g., 700 mV), indicating that the coupling capacitor has not been fully shunted and that some capacitive action remains in the bypass circuit.

Figure 5:
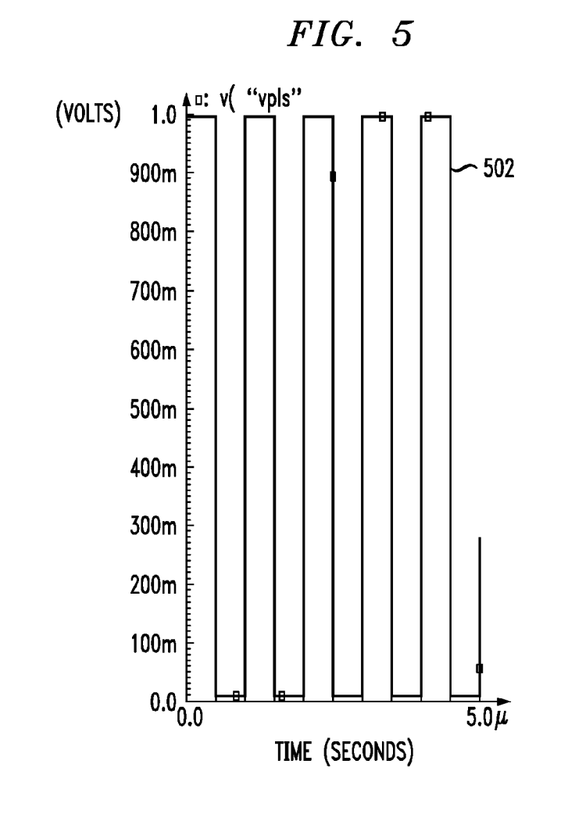
FIG. 5 is a graphical representation depicting illustrative simulation results for a certain node in the exemplary buffer front end shown in FIG. 2.

FIG. 5 depicts illustrative simulation results relating to the exemplary buffer front end 200 shown in FIG. 2, which includes bypass circuit 204 formed in accordance with an embodiment of the invention. These simulation results were obtained using the same input signal 402 shown in FIG. 4. Trace 502 shows the signal ("vpls") at node N2 of front end 200 (see FIG. 2). As apparent from the figure, the voltage at node N2 closely follows the input signal and does not settle to the DC bias voltage, thereby demonstrating that the coupling capacitor has been properly bypassed.

Figure 6:
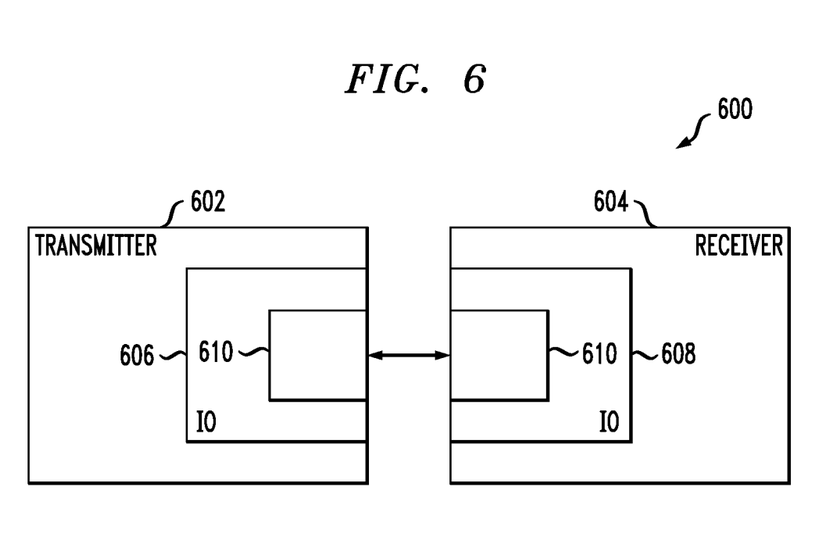
FIG. 6 is a block diagram depicting an illustrative communication system in which the methodologies of the present invention may be implemented, in accordance with an aspect of the invention.

FIG. 6 is a block diagram depicting an illustrative communication system 600 in which the methodologies of the present invention may be implemented, in accordance with an aspect of the invention. It is to be understood that the present invention is not limited to a communication system, but may be employed in various other applications as will become apparent to those skilled in the art. The communication system 600 comprises at least one transmitter 602 and at least one receiver 604, the receiver and transmitter being operative to communicate with one another via a channel or other communication medium (e.g., wireless media, including radio frequency, microwave, infrared, etc., or wired media, including cable, optical fiber, etc). Each of the transmitter 602 and receiver 604 preferably includes 10 circuitry 606 and 608, respectively. At least one of the IO circuitry (e.g., 606 and/or 608) includes a buffer 610 which utilizes a bypass circuit for bypassing a capacitive element therein. At least a portion of an exemplary buffer suitable for use in buffer 610 is shown in FIG. 2 and described above.

At least a portion of the bypass circuitry of the present invention may be implemented in an integrated circuit. In forming integrated circuits, die are typically fabricated in a repeated pattern on a surface of a semiconductor wafer. Each of the die includes a device described herein, and may include other structures or circuits. Individual die are cut or diced from the wafer, then packaged as integrated circuits. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A circuit for selectively bypassing a capacitive element, the circuit comprising:
    at least one NMOS device selectively connectable across the capacitive element to be bypassed; and
    at least first and second PMOS devices, the PMOS devices being selectively connectable together in series across the capacitive element to be bypassed;
    wherein the NMOS device provides a first bypass path and the first and second PMOS devices collectively provide a second bypass path;
    wherein the circuit is selectively operative in one of at least first and second modes as a function of at least one control signal, the circuit shunting the capacitive element through the first and second bypass paths in the first mode, and the circuit being operative to open the first and second bypass paths and thereby prevent the shunting of the capacitive element in the second mode.

2. The circuit of claim 1, wherein the at least one NMOS device has a first threshold voltage associated therewith and each of the at least first and second PMOS devices has a second threshold voltage associated therewith, the second threshold voltage being lower than the first threshold voltage.

3. The circuit of claim 1, wherein the at least one NMOS device and each of the at least first and second PMOS devices has a same threshold voltage associated therewith.

4. The circuit of claim 1, wherein the NMOS device in the first bypass path includes a first source/drain connected to a first terminal of the capacitive element, a second source/drain connected to a second terminal of the capacitive element, and a gate adapted for receiving a first control signal.

5. The circuit of claim 1, further comprising a bias circuit coupled to a first terminal of the capacitive element, the bias circuit being operative to set the first terminal of the capacitive element at a prescribed quiescent voltage.

6. The circuit of claim 1, wherein the capacitive element is comprised in at least a portion of an AC-coupled signal path of another circuit.

7. A circuit for selectively bypassing a capacitive element, the circuit comprising:
    at least one NMOS device selectively connectable across the capacitive element to be bypassed; and
    at least first and second PMOS devices, the PMOS devices being selectively connectable together in series across the capacitive element to be bypassed;
    wherein the NMOS device provides a first bypass path and the first and second PMOS devices collectively provide a second bypass path;
    wherein the NMOS device in the first bypass path includes a first source/drain connected to a first terminal of the capacitive element, a second source/drain connected to a second terminal of the capacitive element, and a gate adapted for receiving a first control signal;
    wherein a first source/drain of the first PMOS device is connected to the first terminal of the capacitive element, a second source/drain of the first PMOS device is connected to a first source/drain of the second PMOS device, a second source/drain of the second PMOS device is connected to the second terminal of the capacitive element, a gate of the second PMOS device is adapted for receiving a logical complement of the first control signal, a gate of the first PMOS device is adapted for receiving a second control signal, and bulks of the first and second PMOS devices are connected to a first voltage, the first voltage being substantially equal to a higher of a supply voltage to which the first control signal is referenced and a level of a signal presented to the first terminal of the capacitive element.

8. A circuit for selectively bypassing a capacitive element, the circuit comprising:
    at least one NMOS device selectively connectable across the capacitive element to be bypassed;
    at least first and second PMOS devices, the PMOS devices being selectively connectable together in series across the capacitive element to be bypassed;
    wherein the NMOS device provides a first bypass path and the first and second PMOS devices collectively provide a second bypass path; and
    a voltage generator circuit operative to generate a first voltage that is substantially equal to a higher of a supply voltage of the circuit and a voltage level of a signal presented to the first terminal of the capacitive element, the voltage generator circuit comprising third and fourth PMOS devices, a first source/drain of the third PMOS device being adapted for receiving the signal presented to the capacitive element, a second source/drain and a bulk of the third PMOS device being connected to a first source/drain and a bulk of the fourth PMOS device at an output node of the voltage generator circuit, a second source/drain of the fourth PMOS device being adapted for connection to the supply voltage of the circuit, a gate of the third PMOS device being connected to the second source/drain of the fourth PMOS device, and a gate of the fourth PMOS device being connected to the first source/drain of the third PMOS device, the first voltage being generated at the output node.

9. A circuit for selectively bypassing a capacitive element, the circuit comprising:
  at least one NMOS device selectively connectable across the capacitive element to be bypassed;
  at least first and second PMOS devices, the PMOS devices being selectively connectable together in series across the capacitive element to be bypassed;
  wherein the NMOS device provides a first bypass path and the first and second PMOS devices collectively provide a second bypass path;
  a pull-down circuit connected between a gate of the first PMOS device and a voltage return of the circuit; and
  a third PMOS device including a first source/drain connected to a first terminal of the capacitive element, a second source/drain connected to the gate of the first PMOS device, and a gate adapted for connection to a supply voltage of the circuit;
  wherein a first source/drain of the NMOS device is connected to the first terminal of the capacitive element, a second source/drain of the NMOS device is connected to a second terminal of the capacitive element, a gate of the NMOS device is adapted for receiving a first control signal, a first source/drain of the first PMOS device is connected to the first terminal of the capacitive element, a second source/drain of the first PMOS device is connected to a first source/drain of the second PMOS device, a second source/drain of the second PMOS device is connected to a second terminal of the capacitive element, a gate of the second PMOS device is adapted for receiving a logical complement of the first control signal, and bulks of the first, second and third PMOS devices are connected to a first voltage, the first voltage being substantially equal to a higher of the supply voltage of the circuit and a voltage level of a signal presented to the first terminal of the capacitive element.

10. An input stage for a buffer circuit, the input stage comprising:
  a signal pad adapted to receive a signal applied to the buffer circuit;
  at least one capacitive element coupled between the signal pad and at least a subsequent stage of the buffer circuit; and
  at least one bypass circuit for selectively bypassing the at least one capacitive element corresponding thereto, the bypass circuit comprising:
    at least one NMOS device selectively connectable across the capacitive element and providing a first bypass path; and
    at least first and second PMOS devices, the PMOS devices being selectively connectable together in series across the capacitive element and collectively providing a second bypass path;
  wherein the at least one bypass circuit is selectively operative in one of at least first and second modes as a function of at least one control signal, the bypass circuit shunting the capacitive element through the first and second bypass paths in the first mode, and the bypass circuit being operative to open the first and second bypass paths and thereby prevent the shunting of the capacitive element in the second mode.

11. The input stage of claim 10, wherein the at least one NMOS device has a first threshold voltage associated therewith and each of the at least first and second PMOS devices has a second threshold voltage associated therewith, the second threshold voltage being lower than the first threshold voltage.

12. The input stage of claim 10, wherein the NMOS device in the first bypass path includes a first source/drain connected to a first terminal of the capacitive element, a second source/drain connected to a second terminal of the capacitive element, and a gate adapted for receiving a first control signal.

13. The input stage of claim 10, further comprising a bias circuit coupled to the capacitive element, the bias circuit being operative to set the subsequent stage of the buffer circuit at a prescribed quiescent voltage.

14. An input stage for a buffer circuit, the input stage comprising:
  a signal pad adapted to receive a signal applied to the buffer circuit;
  at least one capacitive element coupled between the signal pad and at least a subsequent stage of the buffer circuit; and
  at least one bypass circuit for selectively bypassing the at least one capacitive element corresponding thereto, the bypass circuit comprising:
    at least one NMOS device selectively connectable across the capacitive element and providing a first bypass path; and
    at least first and second PMOS devices, the PMOS devices being selectively connectable together in series across the capacitive element and collectively providing a second bypass path;
  wherein the NMOS device in the first bypass path includes a first source/drain connected to a first terminal of the capacitive element, a second source/drain connected to a second terminal of the capacitive element, and a gate adapted for receiving a first control signal;
  wherein a first source/drain of the first PMOS device is connected to the first terminal of the capacitive element, a second source/drain of the first PMOS device is connected to a first source/drain of the second PMOS device, a second source/drain of the second PMOS device is connected to the second terminal of the capacitive element, a gate of the second PMOS device is adapted for receiving a logical complement of the first control signal, a gate of the first PMOS device is adapted for receiving a second control signal, and bulks of the first and second PMOS devices are connected to a first voltage, the first voltage being substantially equal to a higher of a supply voltage to which the first control signal is referenced and a level of a signal presented to the first terminal of the capacitive element.

15. An input stage for a buffer circuit, the input stage comprising:
  a signal pad adapted to receive a signal applied to the buffer circuit;
  at least one capacitive element coupled between the signal pad and at least a subsequent stage of the buffer circuit; and
  at least one bypass circuit for selectively bypassing the at least one capacitive element corresponding thereto, the bypass circuit comprising:
    at least one NMOS device selectively connectable across the capacitive element and providing a first bypass path; and
    at least first and second PMOS devices, the PMOS devices being selectively connectable together in series across the capacitive element and collectively providing a second bypass path;
  wherein the at least one bypass circuit further comprises a voltage generator circuit operative to generate a first voltage that is substantially equal to a higher of a supply voltage of the buffer circuit and a voltage level of the signal applied to the buffer circuit, the voltage generator circuit comprising third and fourth PMOS devices, a first source/drain of the third PMOS device being adapted for receiving the signal applied to the buffer circuit, a second source/drain and a bulk of the third PMOS device being connected to a first source/drain and a bulk of the fourth PMOS device at an output node of the voltage generator circuit, a second source/drain of the fourth PMOS device being adapted for connection to the supply voltage of the buffer circuit, a gate of the third PMOS device being connected to the second source/drain of the fourth PMOS device, and a gate of the fourth PMOS device being connected to the first source/drain of the third PMOS device, the first voltage being generated at the output node.

16. An input stage for a buffer circuit, the input stage comprising:
   a signal pad adapted to receive a signal applied to the buffer circuit;
   at least one capacitive element coupled between the signal pad and at least a subsequent stage of the buffer circuit; and
   at least one bypass circuit for selectively bypassing the at least one capacitive element corresponding thereto, the bypass circuit comprising:
   at least one NMOS device selectively connectable across the capacitive element and providing a first bypass path; and
   at least first and second PMOS devices, the PMOS devices being selectively connectable together in series across the capacitive element and collectively providing a second bypass path;
   wherein the at least one bypass circuit further comprises:
   a pull-down circuit connected between a gate of the first PMOS device and a voltage return of the buffer circuit; and
   a third PMOS device including a first source/drain connected to a first terminal of the capacitive element, a second source/drain connected to the gate of the first PMOS device, and a gate adapted for connection to a supply voltage of the buffer circuit;
   wherein a first source/drain of the NMOS device is connected to the first terminal of the capacitive element, a second source/drain of the NMOS device is connected to a second terminal of the capacitive element, a gate of the NMOS device is adapted for receiving a first control signal, a first source/drain of the first PMOS device is connected to the first terminal of the capacitive element, a second source/drain of the first PMOS device is connected to a first source/drain of the second PMOS device, a second source/drain of the second PMOS device is connected to a second terminal of the capacitive element, a gate of the second PMOS device is adapted for receiving a logical complement of the first control signal, and bulks of the first, second and third PMOS devices are connected to a first voltage, the first voltage being substantially equal to a higher of the supply voltage of the buffer circuit and a voltage level of the signal applied to the buffer circuit.

17. The input stage of claim 16, wherein each of the third and fourth PMOS devices has the second threshold voltage when the supply voltage of the buffer circuit is less than about 1.8 volts, and each of the third and fourth PMOS devices has the first threshold voltage when the supply voltage of the buffer circuit is greater than or equal to about 1.8 volts.

18. An integrated circuit including at least one bypass circuit for selectively bypassing a capacitive element, the at least one bypass circuit comprising:
   at least one NMOS device selectively connectable across the capacitive element to be bypassed; and
   at least first and second PMOS devices, the PMOS devices being selectively connectable together in series across the capacitive element to be bypassed;
   wherein the NMOS device provides a first bypass path and the first and second PMOS devices collectively provide a second bypass path;
   wherein the at least one bypass circuit is selectively operative in one of at least first and second modes as a function of at least one control signal, the bypass circuit shunting the capacitive element through the first and second bypass paths in the first mode, and the bypass circuit being operative to open the first and second bypass paths and thereby prevent the shunting of the capacitive element in the second mode.

19. A communication system, comprising:
   at least one receiver including input/output circuitry; and
   at least one transmitter including input/output circuitry, the receiver and transmitter being operative to communicate with one another via a communication medium;
   wherein at least one of the input/output circuitry in the receiver and in the transmitter includes at least one buffer comprising a circuit for selectively bypassing a capacitive element included in the buffer, the circuit comprising:
   at least one NMOS device selectively connectable across the capacitive element to be bypassed; and
   at least first and second PMOS devices, the PMOS devices being selectively connectable together in series across the capacitive element to be bypassed;
   wherein the NMOS device provides a first bypass path and the first and second PMOS devices collectively provide a second bypass path;
   wherein the at least one bypass circuit is selectively operative in one of at least first and second modes as a function of at least one control signal, the bypass circuit shunting the capacitive element through the first and second bypass paths in the first mode, and the bypass circuit being operative to open the first and second bypass paths and thereby prevent the shunting of the capacitive element in the second mode.

* * * * *